United States Patent
Ray (10) Patent No.: US 10,432,249 B1
(45) Date of Patent: Oct. 1, 2019

(54) UNIVERSAL NONLINEAR VARIABLE DELAY FILTER

(71) Applicant: The Boeing Company, Chicago, IL (US)

(72) Inventor: Gary A. Ray, Issaquah, WA (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 16/008,597

(22) Filed: Jun. 14, 2018

(51) Int. Cl.
| | |
|---|---|
| H03K 5/13 | (2014.01) |
| H04B 1/44 | (2006.01) |
| H01Q 21/22 | (2006.01) |
| H03K 5/135 | (2006.01) |
| H03K 5/131 | (2014.01) |
| H03K 5/00 | (2006.01) |

(52) U.S. Cl.
CPC .............. H04B 1/44 (2013.01); H01Q 21/22 (2013.01); H03K 5/131 (2013.01); H03K 5/135 (2013.01); H03K 2005/00052 (2013.01); H03K 2005/00058 (2013.01)

(58) Field of Classification Search
CPC .......... H04B 1/44; H01Q 21/22; H03K 5/135; H03K 5/131; H03K 2005/00058; H03K 2005/00052
USPC ...................................................... 327/232
See application file for complete search history.

(56) References Cited

U.S. PATENT DOCUMENTS

| | | | | |
|---|---|---|---|---|
| 5,396,189 A | * | 3/1995 | Hays ................. | H03F 1/3247 330/136 |
| 8,400,196 B2 | * | 3/2013 | Kim ..................... | G11C 7/222 327/156 |
| 2007/0254726 A1 | * | 11/2007 | Iida .................... | H04B 1/406 455/572 |
| 2009/0002211 A1 | * | 1/2009 | Breems ............... | H03M 3/354 341/143 |

OTHER PUBLICATIONS

Briggs, Keith; "Another universal differential equation," <http://arxiv.org/abs/math.CA/0211142>, 2002, pp. 1-5.
Fornberg, Bengt; "Generation of Finite Difference Formulas on Arbitrarily Spaced Grids," Mathematics of Computation, 1988, pp. 699-706.
Rubel, Lee A.; "A Universal Differential Equation," Bulletin of the American Mathematical Society, 1981, pp. 345-349.
Duffin, R.J.; "Rubel's universal differential equation," Proceedings of the National Academy of Sciences of the United States of America, 1981, pp. 4661-4662.
Paz, Robert; "Analong Computing Technique," University of Illinois, pp. 1-19, Downloaded from the Internet Apr. 26, 2018, <https://courses.engr.illinois.edu/ece486/sp2018/laboratory/docs/lab1/analog_computer_manual.pdf>.

* cited by examiner

*Primary Examiner* — Ryan Jager
(74) *Attorney, Agent, or Firm* — Sage Patent Group (57) ABSTRACT

A universal nonlinear variable delay filter includes a first mixer configured to convert an input signal to an up-converted signal including a frequency corresponding to a selected time delay. The input signal includes an original frequency. The variable delay filter also includes a nonlinear (Continued)

filter that filters the up-converted signal and generates a delayed signal that is delayed by the selected time delay. The variable delay filter further includes a second mixer configured to convert the delayed signal to a down-converted signal including a frequency substantially equal to the original frequency.

20 Claims, 9 Drawing Sheets

| ORDER OF DERIVATIVE | ORDER OF ACCURACY | APPROXIMATIONS AT $x=0$; $x$-COORDINATES AT NODES: | | | | | | | | |
|---|---|---|---|---|---|---|---|---|---|---|
| | | -4 | -3 | -2 | -1 | 0 | 1 | 2 | 3 | 4 |
| 0 | ∞ | | | | | 1 | | | | |
| 1 | 2 | | | | $\frac{-1}{2}$ | 0 | $\frac{1}{2}$ | | | |
| | 4 | | | $\frac{1}{12}$ | $\frac{-2}{3}$ | 0 | $\frac{2}{3}$ | $\frac{-1}{12}$ | | |
| | 6 | | $\frac{-1}{60}$ | $\frac{3}{20}$ | $\frac{-3}{4}$ | 0 | $\frac{3}{4}$ | $\frac{-3}{20}$ | $\frac{1}{60}$ | |
| | 8 | $\frac{1}{280}$ | $\frac{-4}{105}$ | $\frac{1}{5}$ | $\frac{-4}{5}$ | 0 | $\frac{4}{5}$ | $\frac{-1}{5}$ | $\frac{4}{105}$ | $\frac{-1}{280}$ |
| 2 | 2 | | | | 1 | -2 | 1 | | | |
| | 4 | | | $\frac{-1}{12}$ | $\frac{4}{3}$ | $\frac{-5}{2}$ | $\frac{4}{3}$ | $\frac{-1}{12}$ | | |
| | 6 | | $\frac{1}{90}$ | $\frac{-3}{20}$ | $\frac{3}{2}$ | $\frac{-49}{18}$ | $\frac{3}{2}$ | $\frac{-3}{20}$ | $\frac{1}{90}$ | |
| | 8 | $\frac{-1}{560}$ | $\frac{8}{315}$ | $\frac{-1}{5}$ | $\frac{8}{5}$ | $\frac{-205}{72}$ | $\frac{8}{5}$ | $\frac{-1}{5}$ | $\frac{8}{315}$ | $\frac{-1}{560}$ |
| 3 | 2 | | | $\frac{-1}{2}$ | 1 | 0 | -1 | $\frac{1}{2}$ | | |
| | 4 | | $\frac{-1}{8}$ | -1 | $\frac{13}{8}$ | 0 | $\frac{-13}{8}$ | 1 | $\frac{1}{8}$ | |
| | 6 | $\frac{-7}{240}$ | $\frac{3}{10}$ | $\frac{-169}{120}$ | $\frac{61}{30}$ | 0 | $\frac{-61}{30}$ | $\frac{169}{60}$ | $\frac{-3}{10}$ | $\frac{7}{240}$ |
| 4 | 2 | | | 1 | -4 | 6 | -4 | 1 | | |
| | 4 | | $\frac{-1}{6}$ | 2 | $\frac{-13}{2}$ | $\frac{28}{3}$ | $\frac{-13}{2}$ | 2 | $\frac{-1}{6}$ | |
| | 6 | $\frac{7}{240}$ | $\frac{-2}{5}$ | $\frac{169}{60}$ | $\frac{-122}{15}$ | $\frac{91}{8}$ | $\frac{-122}{15}$ | $\frac{169}{60}$ | $\frac{-2}{5}$ | $\frac{7}{240}$ |

FIG. 3

| ORDER OF DERIVATIVE | ORDER OF ACCURACY | APPROXIMATIONS AT $x=0$; $x$-COORDINATES AT NODES: | | | | | | | | |
|---|---|---|---|---|---|---|---|---|---|---|
| | | 0 | 1 | 2 | 3 | 4 | 5 | 6 | 7 | 8 |
| 0 | ∞ | | | | | | | | | |
| 1 | 1 | $-1$ | $1$ | | | | | | | |
| | 2 | $\frac{-3}{2}$ | $2$ | $\frac{-1}{2}$ | | | | | | |
| | 3 | $\frac{-11}{6}$ | $3$ | $\frac{-3}{2}$ | $\frac{1}{3}$ | | | | | |
| | 4 | $\frac{-25}{12}$ | $4$ | $-3$ | $\frac{4}{3}$ | $\frac{-1}{4}$ | | | | |
| | 5 | $\frac{-137}{60}$ | $5$ | $-5$ | $\frac{10}{3}$ | $\frac{-5}{4}$ | $\frac{1}{5}$ | | | |
| | 6 | $\frac{-49}{20}$ | $6$ | $\frac{-15}{2}$ | $\frac{20}{3}$ | $\frac{-15}{4}$ | $\frac{6}{5}$ | $\frac{-1}{6}$ | | |
| | 7 | $\frac{-363}{140}$ | $7$ | $\frac{-21}{2}$ | $\frac{35}{3}$ | $\frac{-35}{4}$ | $\frac{21}{5}$ | $\frac{-7}{6}$ | $\frac{1}{7}$ | |
| | 8 | $\frac{-761}{280}$ | $8$ | $-14$ | $\frac{56}{3}$ | $\frac{-35}{2}$ | $\frac{56}{5}$ | $\frac{-14}{3}$ | $\frac{8}{7}$ | $\frac{-1}{8}$ |
| 2 | 1 | $1$ | $-2$ | $1$ | | | | | | |
| | 2 | $2$ | $-5$ | $4$ | $-1$ | | | | | |
| | 3 | $\frac{35}{12}$ | $\frac{-26}{3}$ | $\frac{19}{2}$ | $\frac{-14}{3}$ | $\frac{11}{12}$ | | | | |
| | 4 | $\frac{15}{4}$ | $\frac{-77}{6}$ | $\frac{107}{6}$ | $-13$ | $\frac{61}{12}$ | $\frac{-5}{6}$ | | | |
| | 5 | $\frac{203}{45}$ | $\frac{-87}{5}$ | $\frac{117}{4}$ | $\frac{-254}{9}$ | $\frac{33}{2}$ | $\frac{-27}{5}$ | $\frac{137}{180}$ | | |
| | 6 | $\frac{469}{90}$ | $\frac{-223}{10}$ | $\frac{879}{20}$ | $\frac{-949}{18}$ | $41$ | $\frac{-201}{10}$ | $\frac{1019}{180}$ | $\frac{-7}{10}$ | |
| | 7 | $\frac{29531}{5040}$ | $\frac{-962}{35}$ | $\frac{621}{10}$ | $\frac{-4006}{45}$ | $\frac{691}{8}$ | $\frac{-282}{5}$ | $\frac{2143}{90}$ | $\frac{-206}{35}$ | $\frac{363}{560}$ |
| 3 | 1 | $-1$ | $3$ | $-3$ | $1$ | | | | | |
| | 2 | $\frac{-5}{2}$ | $9$ | $-12$ | $7$ | $\frac{-3}{2}$ | | | | |
| | 3 | $\frac{-17}{4}$ | $\frac{71}{4}$ | $\frac{-59}{2}$ | $\frac{49}{2}$ | $\frac{-41}{4}$ | $\frac{7}{4}$ | | | |
| | 4 | $\frac{-49}{8}$ | $29$ | $\frac{-461}{8}$ | $62$ | $\frac{307}{8}$ | $13$ | $\frac{-15}{8}$ | | |
| | 5 | $\frac{-967}{120}$ | $\frac{638}{15}$ | $\frac{-3929}{40}$ | $\frac{389}{3}$ | $\frac{-2545}{24}$ | $\frac{268}{5}$ | $\frac{-1849}{120}$ | $\frac{29}{15}$ | |
| | 6 | $\frac{-801}{80}$ | $\frac{349}{6}$ | $\frac{-18353}{120}$ | $\frac{2391}{10}$ | $\frac{-1457}{6}$ | $\frac{4891}{30}$ | $\frac{-561}{8}$ | $\frac{527}{30}$ | $\frac{-469}{240}$ |
| 4 | 1 | $1$ | $-4$ | $6$ | $-4$ | $1$ | | | | |
| | 2 | $3$ | $-14$ | $26$ | $-24$ | $11$ | $-2$ | | | |
| | 3 | $\frac{35}{6}$ | $-31$ | $\frac{137}{2}$ | $\frac{-242}{3}$ | $\frac{107}{2}$ | $-19$ | $\frac{17}{6}$ | | |
| | 4 | $\frac{28}{3}$ | $-111$ | $142$ | $\frac{-1219}{6}$ | $176$ | $\frac{-185}{2}$ | $\frac{82}{3}$ | $\frac{-7}{2}$ | |
| | 5 | $\frac{1069}{80}$ | $\frac{-1316}{15}$ | $\frac{15289}{60}$ | $\frac{-2144}{5}$ | $\frac{10993}{24}$ | $\frac{-4772}{15}$ | $\frac{2803}{20}$ | $\frac{-536}{15}$ | $\frac{967}{240}$ |

UNIVERSAL NONLINEAR VARIABLE DELAY FILTER

FIELD

The present disclosure relates to filters for filtering signals and more particularly to a universal nonlinear variable delay filter.

BACKGROUND

Existing variable delay elements in systems, such as communications systems, require complex filter coefficient changes or switching of many small delay elements, whether in phase or time, and such elements have limited precision. Additionally, existing variable delay elements typically operate near or at the full radio frequency (RF) signal frequency to be effective after down-conversion. Also, in some applications, the delays required are too small to be effectively implemented using existing variable delay elements.

SUMMARY

In accordance with an embodiment, a universal nonlinear variable delay filter includes a first mixer configured to convert an input signal to an up-converted signal including a frequency corresponding to a selected time delay. The input signal includes an original frequency. The variable delay filter also includes a nonlinear filter that filters the up-converted signal and generates a delayed signal that is delayed by the selected time delay. The variable delay filter further includes a second mixer configured to convert the delayed signal to a down-converted signal including a frequency substantially equal to the original frequency.

In accordance with another embodiment, a communications system includes a signal source and a universal nonlinear variable delay filter operatively connected to the signal source. The universal nonlinear variable delay filter includes a first mixer configured to convert an input signal to an up-converted signal including a frequency corresponding to a selected time delay. The input signal including an original frequency. The communications system also includes a nonlinear filter that filters the up-converted signal and generates a delayed signal that is delayed by the selected time delay. The communications system further includes a second mixer configured to convert the delayed signal to a down-converted signal including a frequency substantially equal to the original frequency.

In accordance with a further embodiment, a method for implementing a delay in a radio frequency (RF) signal including converting an input signal to an up-converted signal including a frequency corresponding to a selected time delay. The input signal including an original frequency. The method also includes filtering the up-converted signal and generating a delayed signal that is delayed by the selected time delay. The method further includes converting the delayed signal to a down-converted signal including a frequency substantially equal to the original frequency.

In accordance with an embodiment and any of the previous embodiments, the universal nonlinear variable delay filter is implemented in a digital form or an analog form, wherein the selected time delay is controlled by a mixing frequency of a reference signal or a mixing signal mixed with the input signal in the digital form and the selected time delay is controlled by a signal from a voltage controlled oscillator in the analog form.

In accordance with an embodiment and any of the previous embodiments, the first mixer is configured to mix the input signal and a first mixing signal including a mixing frequency that caused the input signal to be frequency shifted or up-converted to the frequency corresponding to the selected time delay.

In accordance with an embodiment and any of the previous embodiments, the second mixer is configured to mix the delayed signal and a second mixing signal including a mixing frequency that causes the delayed signal to be frequency shifted or down-converted to the frequency substantially equal the original frequency.

In accordance with an embodiment and any of the previous embodiments, the universal nonlinear variable delay filter further includes a variable frequency generator configured for generating the first mixing signal and the second mixing signal.

In accordance with an embodiment and any of the previous embodiments, the nonlinear filter is derived from a universal differential equation.

In accordance with an embodiment and any of the previous embodiments, the universal differential equation is discretized and converted to a universal difference equation form that defines a four input filter function.

In accordance with an embodiment and any of the previous embodiments, the universal differential equation is discretized and converted using centered difference approximations of various derivative orders of the universal differential equation or one sided difference approximations of various derivative orders of the universal differential equation.

In accordance with an embodiment and any of the previous embodiments, the universal differential equation is discretized and converted to a digital filter form to create a nonlinear digital variable delay filter.

In accordance with an embodiment and any of the previous embodiments, the nonlinear filter includes an analog universal differential equation filter and the first mixer and the second mixer each include an analog mixer.

In accordance with an embodiment and any of the previous embodiments wherein the nonlinear filter is an analog universal differential equation filter, the universal nonlinear variable delay filter further includes a voltage controlled oscillator operatively connected to the first mixer and the second mixer. The first mixer mixes the input signal with a first mixing signal from the voltage controlled oscillator to convert the input signal to an analog up-converted signal including the frequency corresponding to the selected time delay. The second mixer mixes the delayed signal with a second mixing signal from the voltage controlled oscillator to convert the delayed signal to an analog down-converted signal including the frequency substantially equal to the original frequency.

In accordance with an embodiment and any of the previous embodiments that include an analog universal differential equation filter, a low pass filter is configured to filter any spurious signals or noise from the analog up-converted signal and a high pass filter configured to filter any spurious signals or noise from the analog down-converted signal to provide an analog delayed signal comprising the frequency substantially equal the original frequency.

In accordance with an embodiment and any of the previous embodiments, the universal nonlinear delay filter is a component of a phased array antenna system.

In accordance with an embodiment and any of the previous embodiments wherein the universal nonlinear filter is a component of a communications system or phased array antenna system. The phased array antenna system includes a plurality of antenna elements. The phased array antenna system is configured for directing a signal beam in different directions. The communications system or phased array antenna system also includes a plurality of transmit/receive (T/R) modules. One T/R module is associated with each antenna element of the phased array antenna system. The communications system or phased array antenna system also includes a beam steering controller. The beam steering controller transmits a particular module delay signal to each T/R module for controlling a direction of the signal beam from the phased array antenna system.

In accordance with an embodiment and any of the previous embodiments, the universal nonlinear delay filter is a component of a multiple input multiple output communications system.

In accordance with an embodiment and any of the previous embodiments where the universal nonlinear delay filter is a component of a multiple input multiple output communications system, the system further includes a signal delay controller. The signal delay controller transmits a control signal to the universal nonlinear variable delay filter to control a delay of the output signals.

The features, functions, and advantages that have been discussed can be achieved independently in various embodiments or may be combined in yet other embodiments further details of which can be seen with reference to the following description and drawings.

DETAILED DESCRIPTION

The following detailed description of embodiments refers to the accompanying drawings, which illustrate specific embodiments of the disclosure. Other embodiments having different structures and operations do not depart from the scope of the present disclosure. Like reference numerals may refer to the same element or component in the different drawings.

Figure 1:
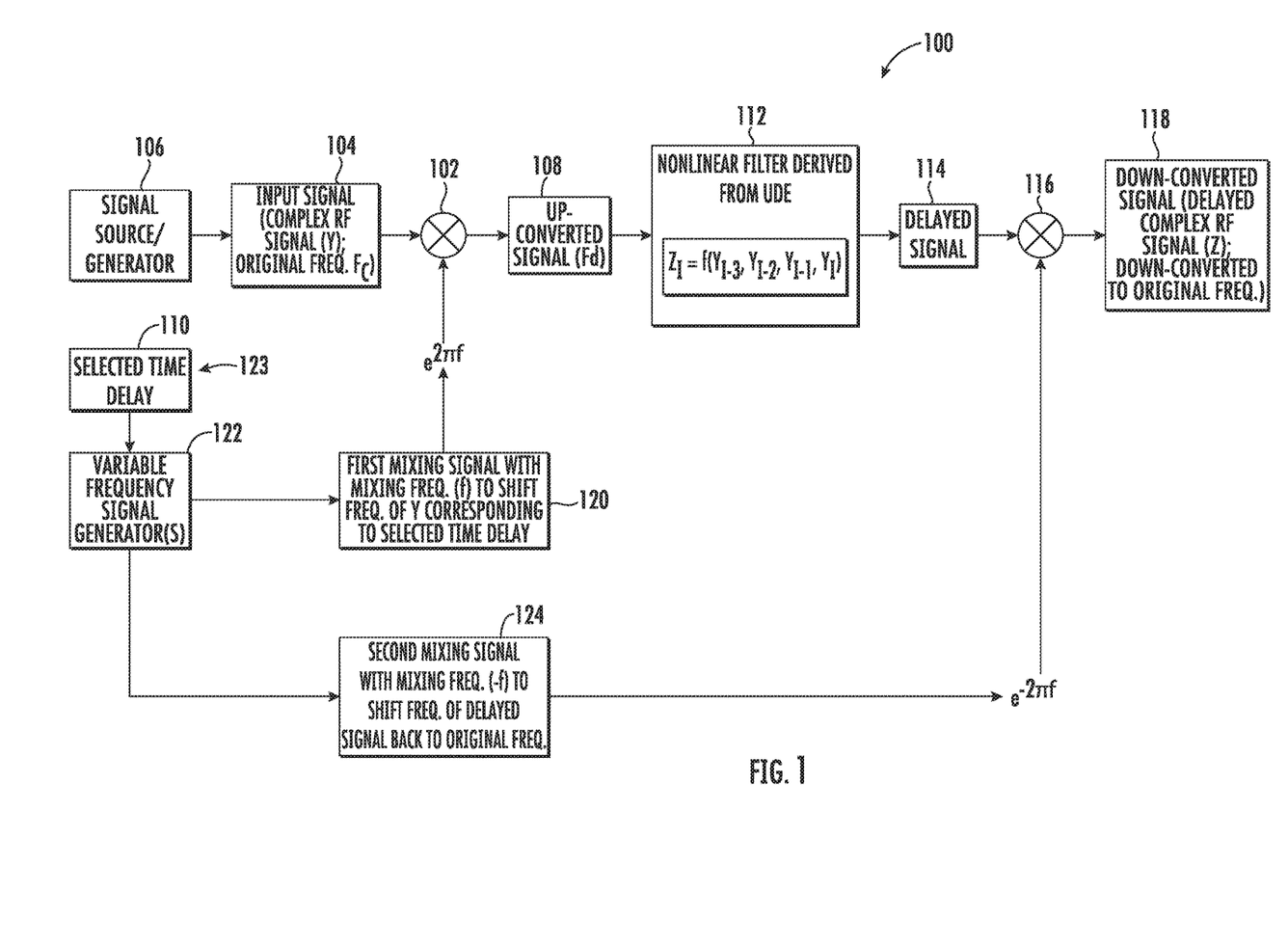
FIG. 1 is a block schematic diagram of an example of a universal nonlinear digital variable delay filter in accordance with an embodiment of the present disclosure.

FIG. 1 is a block schematic diagram of an example of a universal nonlinear digital variable delay filter 100 in accordance with an embodiment of the present disclosure. The universal nonlinear digital variable delay filter 100 may also be referred to herein as simply digital variable delay filter 100. The digital variable delay filter 100 includes a first mixer 102 that receives an input signal 104 having an original frequency (Fc) from a signal source 106 or generated by a signal generator. The input signal 104 is a complex RF signal (Y) including an amplitude component and a phase component. The first mixer 102 is configured to convert the input signal 104 to an up-converted signal 108. The up-converted signal 108 including a frequency (Fd) corresponding to a selected time delay 110.

The digital variable delay filter 100 also includes a nonlinear filter 112 that filters the up-converted signal 108 and generates a delayed signal 114 that is delayed by the selected time delay 110. In accordance with an embodiment, the nonlinear filter 112 is derived from a universal differential equation (UDE) as described in more detail herein. The digital variable delay filter 100 is implemented in a digital form as described in more detail with reference to FIG. 2 or an analog form as described in more detail with reference to FIG. 6.

The digital variable delay filter 100 further includes a second mixer 116. The second mixer 116 is configured to convert the delayed signal 114 to a down-converted signal 118 that is delayed by the selected time delay 110. The down-converted signal 118 includes a frequency that is the same as or substantially equal to the original frequency (Fc). The down-converted signal 118 is a delayed complex RF signal (Z) that is delayed by the selected time delay and includes an amplitude component and a phase component.

The first mixer 102 is configured to mix the input signal 104 and a first mixing signal 120. The first mixing signal 120 includes a mixing frequency (f) that caused the input signal 104 to be frequency shifted or up-converted to the frequency corresponding to the selected time delay 110. In accordance with an embodiment, the first mixing signal 120 is generated by a variable frequency generator 122. The variable frequency generator 122 generates the first mixing signal 120 based on the selected time delay 110 of the down-converted signal 118 or delayed complex output signal. The selected time delay 110 of the down-converted signal 118 is controlled by the mixing frequency of a reference signal or the first mixing signal 120 mixed with the input signal 104.

The variable frequency generator 122 is controlled by a signal 123 that corresponds to the selected time delay 110 or causes the input signal 104 to be delayed by the selected time delay 110 by the digital variable delay filter 100 as described herein.

The second mixer 116 is configured to mix the delayed signal 114 and a second mixing signal 124 including a mixing frequency (−f) that causes the delayed signal 114 to be frequency shifted or down-converted to the frequency equal to or substantially equal to the original frequency (Fc). The variable frequency generator 122 may be configured for generating the first mixing signal 120 and the second mixing signal 124. In another embodiment, a separate frequency generator may generate the first mixing signal 120 and the second mixing signal 124.

In accordance with an embodiment, the nonlinear filter 112 is derived from the exemplary universal differential equation (UDE) in Equation 1 where n can be any integer >3:

$$y''''y'^2 - 3y'''y''y' + 2(1-n^{-2})y''^3 = 0 \quad \text{Equation 1}$$

Other UDE's may also be used. To use the UDE in Equation 1 in a digital form, the UDE is discretized and converted to a universal difference equation form that defines a four input filter function. If $y'$ is not zero in Equation 1, Equation 1 may be rewritten as Equation 2:

$$y''' = (3y'''y''y' + 2(1-n^{-2})y''^3)/y'^2 \quad \text{Equation 2}$$

Figure 3:
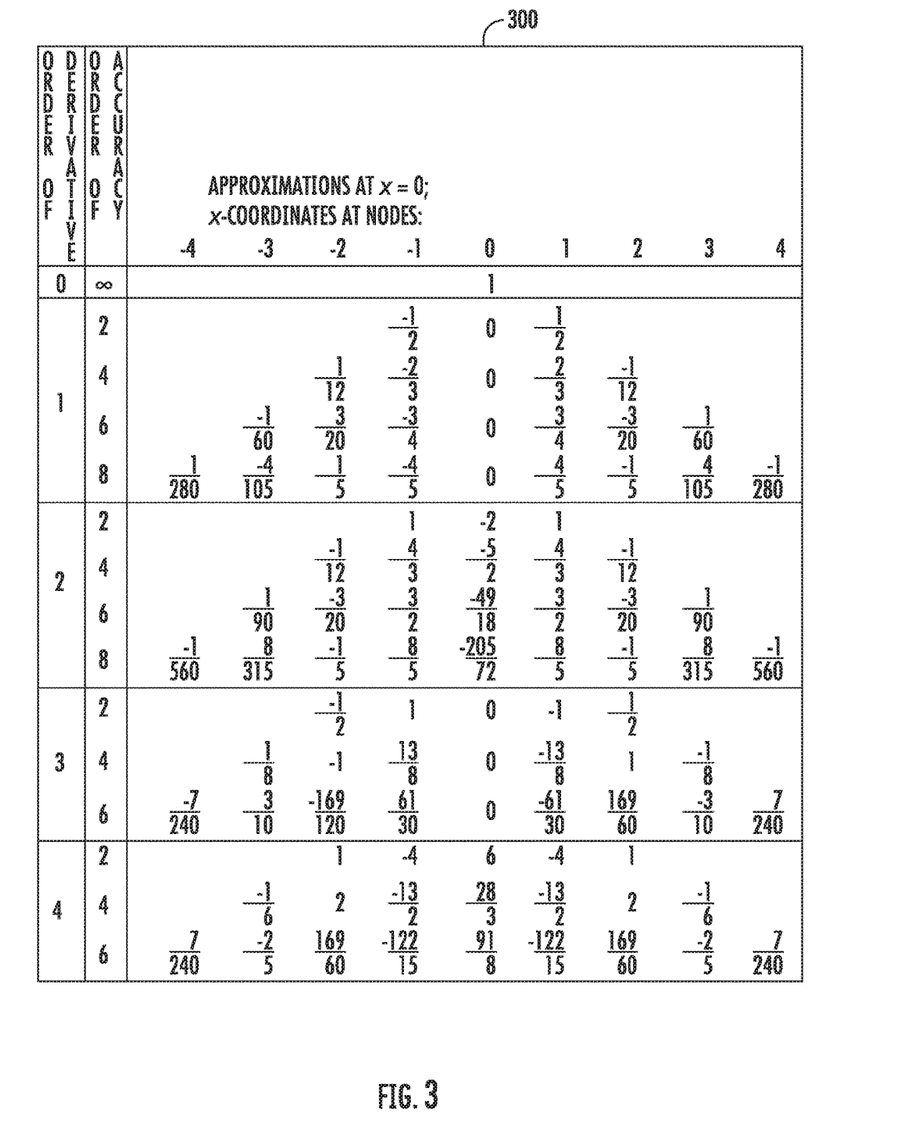
FIG. 3 is a table of centered difference approximations of various derivative orders for conversion of a universal differential equation to a digital filter form for implementation of an exemplary digital variable delay filter in accordance with another embodiment of the present disclosure.
Figure 4:
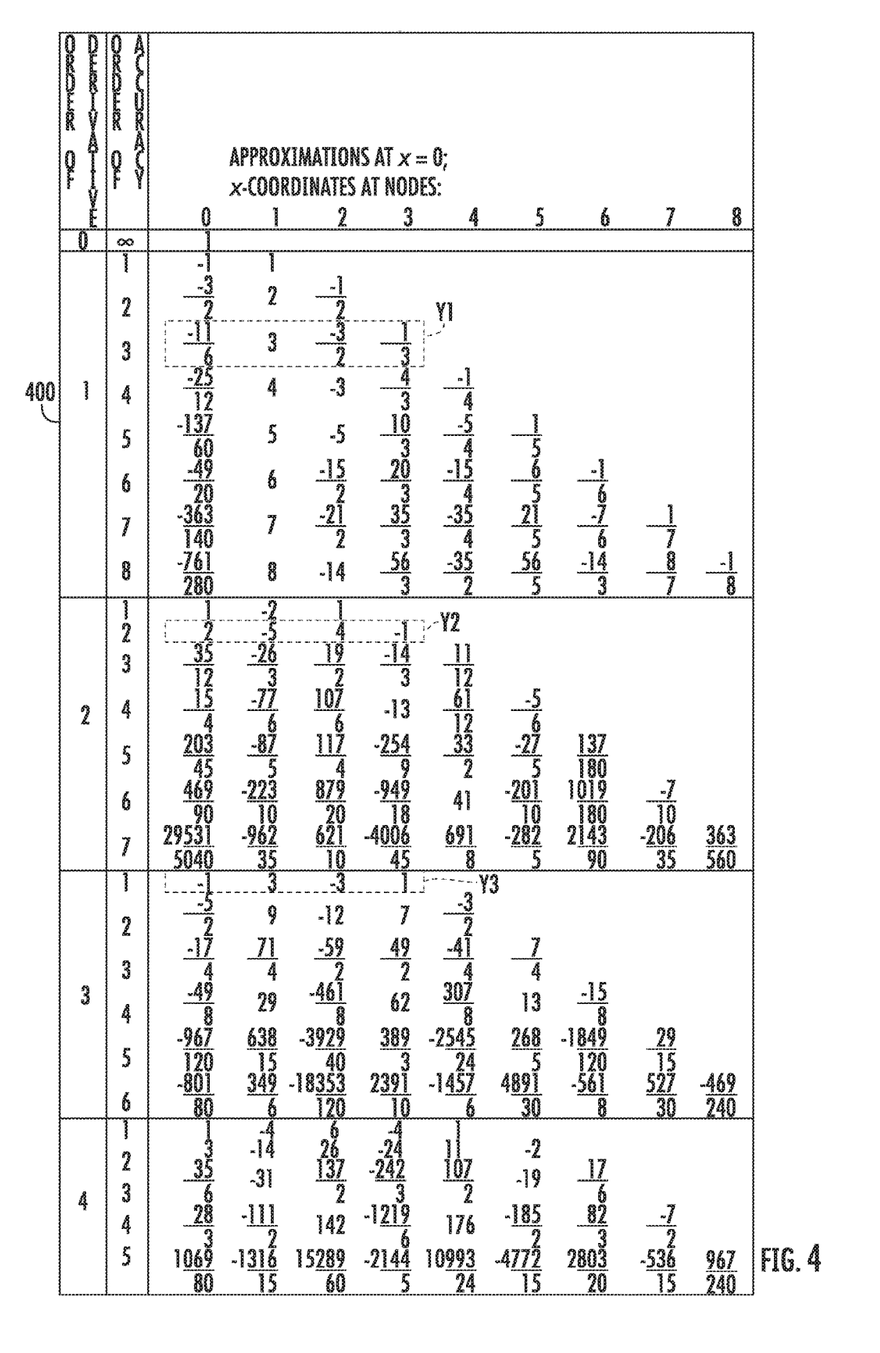
FIG. 4 is a table of one sided difference approximations of various derivative orders for conversion of a universal differential equation to a digital filter form for implementation of an exemplary digital variable delay filter in accordance with an embodiment of the present disclosure.

Assuming that n=4, although higher values of n are valid as well, the universal differential equation (UDE) in Equation 2 is discretized and converted using centered difference approximations of various derivative orders of the UDE as shown in table 300 of FIG. 3 or one sided difference approximations of various derivative orders of the UDE as shown in table 400 of FIG. 4.

In accordance with an embodiment, using the one sided differences in table 400 and choosing the order so that only five values occur in the difference equation, the difference equation can be solved for $y_5$ as a function of $\{y_1, y_2, y_3, y_4\}$ as follows:

$$y_5 = \frac{3Y3 \cdot Y2 \cdot Y1 - 2(1-n^{-2}) \cdot Y2^3}{Y1^2} - y_1 + 4y_2 - 6y_3 + 4y_4 \quad \text{Equation 3}$$

Where using the coefficients from table 400:

$$Y1 = -\frac{11}{6}y_1 + 3y_2 - \frac{3}{2}y_3 + \frac{1}{3}y_4 \quad \text{Equation 4}$$

$$Y2 = 2y_1 - 5y_2 + 4y_3 - y_4 \quad \text{Equation 5}$$

$$Y3 = -y_1 + 3y_2 - 3y_3 + y_4 \quad \text{Equation 6}$$

This defines a four input filter function which takes in a sequence of complex input signals (y's) and produces a sequence of delayed complex output signals (z's) where:

$$z_i = f(y_{i-3}, y_{i-2}, y_{i-1}, y_i) \quad \text{Equation 7}$$

Figure 2:
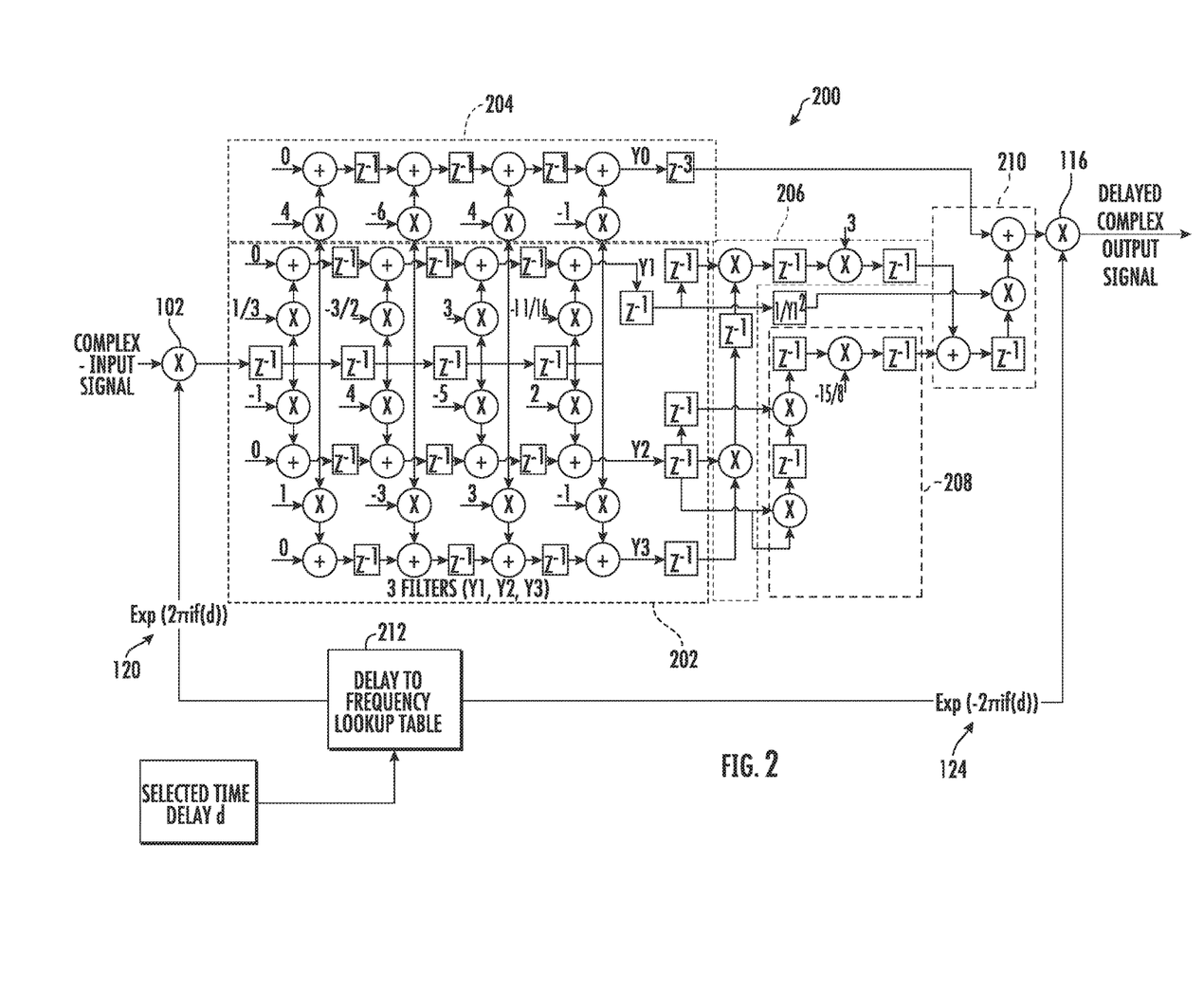
FIG. 2 is an example of a digital variable delay filter in accordance with an embodiment of the present disclosure.

Referring also to FIG. 2, FIG. 2 is an example of a digital variable delay filter 200 in accordance with an embodiment of the present disclosure. The digital variable delay filter 200 illustrates an implementation of the universal difference equation in Equation 3. The digital variable delay filter 200 may be embodied on a field programmable gate array (FPGA) or similar electronic device. In accordance with an embodiment, the digital variable delay filter 200 is used for the digital variable delay filter 100 in FIG. 1. Box 202 contains a pipelined circuit implementation of the computations for Y1 (Equation 4), Y2 (Equation 5), and Y3 (Equation 6). These can be implemented as direct form digital filters. Box 204 is a circuit implementation as a direct form digital filter of the denominator of Equation 3. Box 206 is a circuit implementation of the calculation for 3Y3·Y2·Y1 in Equation 3. Box 208, is a circuit implementation of the calculation for $2(1-n^{-2}) \cdot Y2^3$ in Equation 3. Box 210 is a circuit implementation of the final calculation of Equation 3.

A delay-to-frequency lookup table 212 is used to represent generation of the mixing signals 120 and 124 that are used to control the variable delay of the digital variable delay filter 200. The delay-to-frequency lookup table 212 is derived from a graph 500 in FIG. 5A of a group delay response 502 of the exemplary digital variable delay filter 200 in signal phase over a predetermined frequency range and a graph 504 in FIG. 5B of the magnitude response 506 of the exemplary digital variable delay filter 200 in accordance with an embodiment of the present disclosure. Generation of the graphs 500 and 504 are described in more detail with reference to FIGS. 5A and 5B.

In accordance with the example described above, the nonlinear filter 112 or universal nonlinear digital variable delay filter 100 is created as a digital variable delay filter 200 using the difference Equation 3 where Y1, Y2 and Y3 are defined by Equations 4, 5 and 6 respectively. In other embodiments, the universal nonlinear digital variable delay filter 100 or digital variable delay filter 200 may be implemented using other universal differential equations and the disclosure is not intended to be limited by the exemplary embodiments described herein.

The mixing frequency of the first mixing signal 120 in FIG. 1 may be denoted by "f". As previously described, the digital variable delay filter 100 operates by up-converting the incoming complex RF signal "Y" or input signal 104 and moving the input signal 104 in frequency to a frequency f (the mixing frequency) that corresponds with the selected delay of the universal difference equation in Equation 3. The up-converted signal 108 is then filtered thus delaying the signal by the selected time delay 110. The delayed signal 114 from the nonlinear filter 112 or digital variable delay filter 200 is then down-converted by moving the delayed signal 114 back to the original frequency $F_c$ of the input signal 104. The following describes how the mixing frequency f is chosen to achieve the selected time delay 110.

In accordance with an embodiment, the nonlinear filter 112 or digital variable delay filter 200 is implemented in software by using a chirped input signal. A group delay response 502 and magnitude response 506 of an output signal from the nonlinear filter 112 or digital variable delay filter 200 are measured at different frequency over a predetermined range of frequencies that a system in which the digital variable delay filter 100 is expected to be deployed. Examples of systems in which the digital variable delay filter 100 may be deployed include, but are not necessarily limited to a communications system 700 including a phased array antenna system 702 described with reference to FIGS. 7 and 8 and a multiple input multiple output (MIMO) communications system 900 described with reference to FIG. 9. The digital variable delay filter 100 or 200 may be used in any application where a precisely delayed signal as described herein is desired or useful.

Figure 5A:
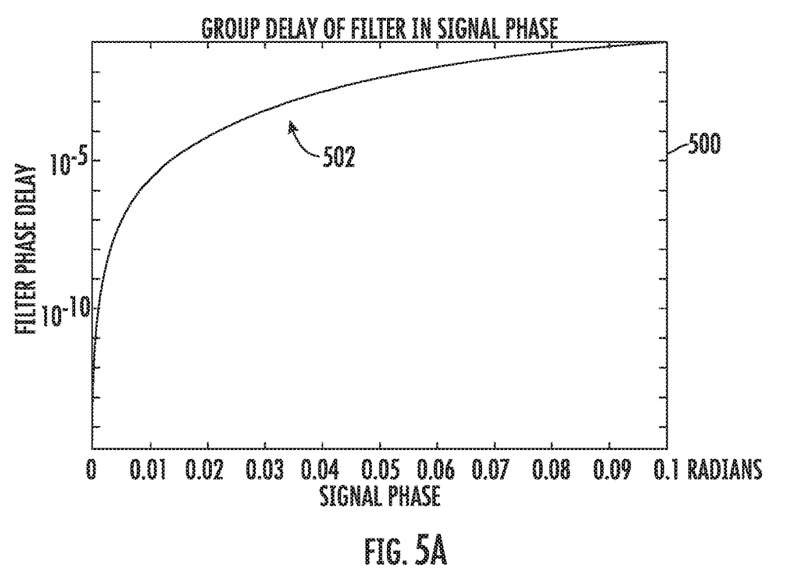
FIG. 5A is a graph of the group delay of an exemplary nonlinear filter in signal phase in accordance with an embodiment of the present disclosure.
Figure 5B:
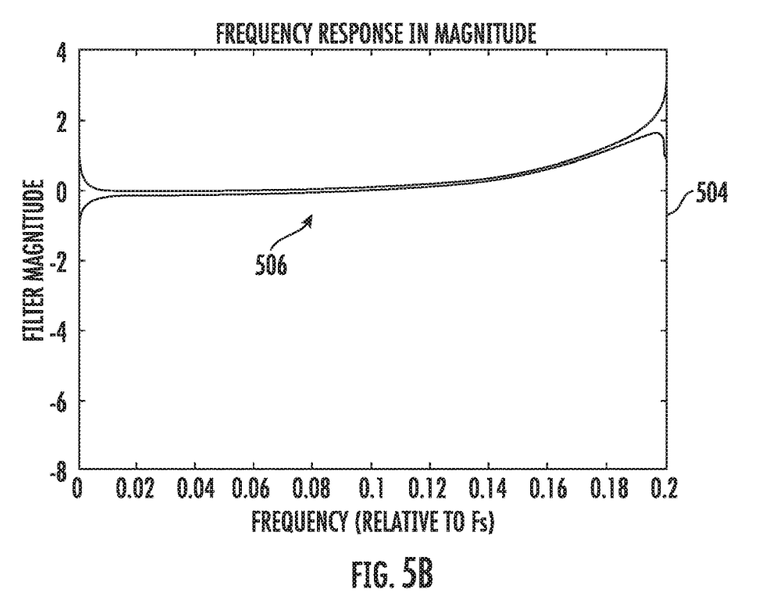
FIG. 5B is a graph of the magnitude response of an exemplary nonlinear filter in accordance with an embodiment of the present disclosure.

Referring also to FIGS. 5A and 5B, FIG. 5A is a graph 500 of measurements of a group delay response 502 for the particular universal difference equation in Equation 3 with n=4 or the exemplary digital variable delay filter 200. Phase in FIG. 5A is the normal complex phase of a signal or in other words the complex argument of a signal sample and is between −pi and pi and is in radians. FIG. 5B is the unitless ratio of the frequency divided by Fs, the sample frequency.

FIG. 5B is a graph 504 of measurements of a magnitude response 506 for the particular universal difference equation in Equation 3 with n=4 or the exemplary digital variable delay filter 200. The group delay response 502 shows the non-linear dependency of the time delay on the frequency of the signal and the frequency response in FIG. 5B shows that the magnitude is nearly constant across a large range of frequencies.

The following describes how the results in FIGS. 5A and 5B are used to create a desired time delay or a selected time delay in a signal. Assume there is an RF signal "s" with a center frequency $f_c$ and the RF signal's down-converted and filtered digital version "S" in sampled form $\{y_i\}$ at a sample rate of $F_s$ and a relative frequency of $F_c$. Taking the selected time delay "d" and referencing $d/F_s$ on the Y-axis of the group delay response 502, a corresponding relative frequency $f_r$ is found on the magnitude response 506 which is mixed with the digital signal S to move the center $F_c$ to f by mixing using complex multiplication with a tone of frequency $f_r-F_c$. This tone can be represented mathematically by the sequence of complex numbers $e^{2\pi f(f_r-F_c)i}$. As previously discussed, after the delay, the delayed signal 114 is mixed with frequency $F_c-f_r$ to down-convert the signal back to the original frequency $f_c$ with the selected time delay 110. The signal magnitude response 506 increases as the signal frequency nears 0.2 Fs. Accordingly the sample rate Fs is preferably greater than about five times Fc (Fs>5Fc) to avoid signal distortion caused by the magnitude response not being nearly constant for larger relative frequencies. The sample rate can thus be chosen in order to both achieve a particular delay and have a filter magnitude response variation that is acceptable for the given signal delay application.

Figure 6:
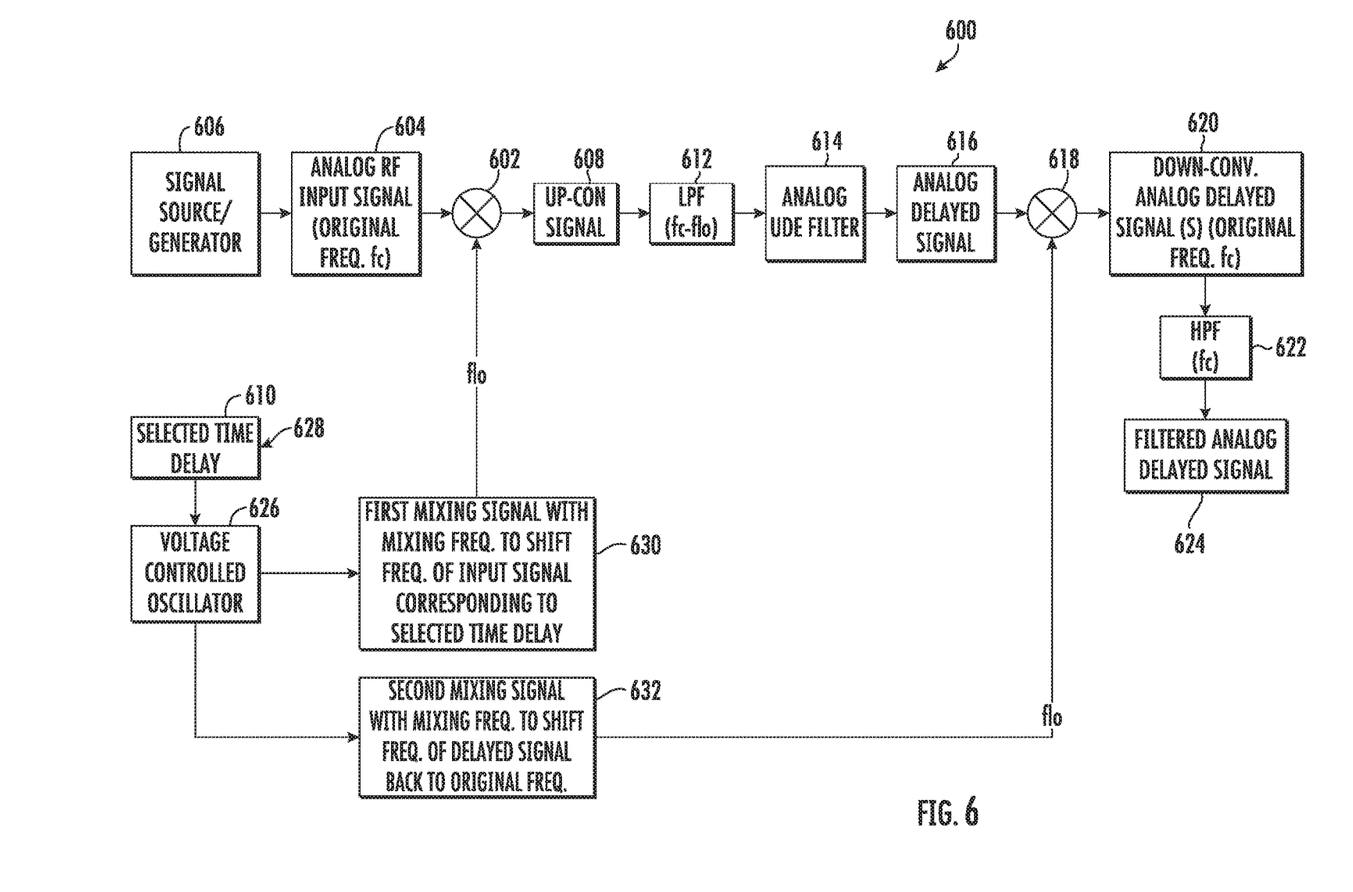
FIG. 6 is a block schematic diagram of an example of an analog implementation of a universal nonlinear variable delay filter in accordance with an embodiment of the present disclosure.

FIG. 6 is a block schematic diagram of an example of an analog implementation 600 of a universal nonlinear variable delay filter in accordance with an embodiment of the present disclosure. The analog universal nonlinear variable delay filter 600 is similar to the digital variable delay filter 100 in FIG. 1 except that some components are replaced by analog components. For example, the nonlinear filter 112 is replaced by an analog UDE filter 614 and the first mixer 102 and the second mixer 116 are replaced by analog mixers 602 and 618. The analog universal nonlinear variable delay filter 600 or simply analog variable delay filter 600 includes a first analog mixer 602 that receives an analog RF input signal 604 from a signal source 606 or signal generator. The analog RF input signal 604 has an original frequency fc. The first analog mixer 602 is configured to convert the input signal 604 to an analog up-converted signal 608 having a frequency corresponding to a selected time delay 610. A low pass filter (LPF) 612 filters the analog up-converted signal 608 from the first analog mixer 602 to remove any spurious signals or noise.

The analog variable delay filter 600 also includes an analog UDE filter 614 that filters the analog up-converted signal 608 and generates an analog delayed signal 616 that is delayed by the selected time delay 610. The UDE filter 614 is configured to implement the UDE in Equation 1 in analog form. This could take different forms and can be implemented using analog components such as operational amplifiers that provide a similar solution to the UDE in Equation 1 to that described with respect to the digital variable delay filter 100 or 200 in FIGS. 1 and 2.

A second analog mixer 618 is configured to convert the analog delayed signal 616 to an analog down-converted signal 620 including a frequency equal to or substantially equal to the original frequency fc. A high pass filter (HPF) 622 filters the analog down-converted signal 620 to remove any spurious signals or noise from the analog down-converted signal 620 and provide a filtered analog delayed signal 624.

In accordance with an embodiment, the analog variable delay filter 600 further includes a voltage controlled oscillator 626 operatively connected to the first analog mixer 602 and the second analog mixer. The voltage controlled oscillator 626 is controlled by a signal 628 that corresponds to the selected time delay 610 or causes the input signal 604 to be delayed by the selected time delay 610 by the analog variable delay filter 600 as described herein. The first analog mixer 602 mixes the input signal 604 with a first mixing signal 630 from the voltage controlled oscillator 626 to convert the input signal 604 to the analog up-converted signal 608 comprising the frequency corresponding to the selected time delay 610. The second analog mixer 618 mixes the analog delayed signal 616 with a second mixing signal 632 from the voltage controlled oscillator 626 to convert the analog delayed signal 616 to the analog down-converted signal 620 including the frequency fc equal to or substantially equal to the original frequency fc.

Figure 7:
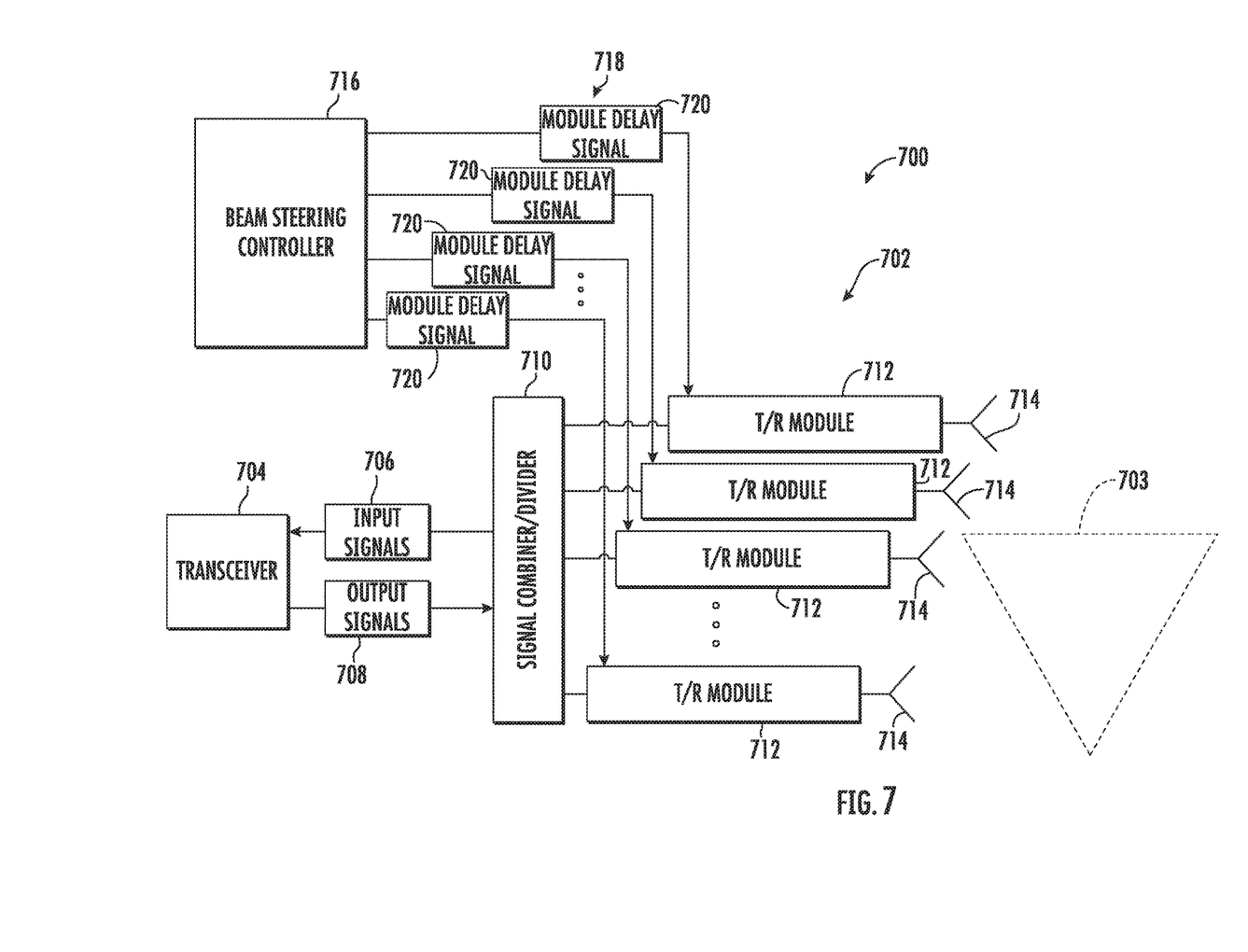
FIG. 7 is a block schematic diagram of an example of a communications system including a phased array antenna system in accordance with an embodiment of the present disclosure.

FIG. 7 is a block schematic diagram of an example of a communications system 700 including a phased array antenna system 702 in accordance with an embodiment of the present disclosure. The phased array antenna system 702 is configured for directing a signal beam 703 in different directions. The communications system 700 includes a transceiver 704 configured for receiving input signals 706 and transmitting output signals 708. The communications system 700 also includes a signal combiner/divider 710 that operatively connects the transceiver 704 to a plurality of transmit/receive (T/R) modules 712 of the phased array antenna system 702. Each T/R module 712 is operatively connected to an antenna or antenna element 714 of the phased array antenna system 702. An example of a T/R module 712 that may be used with the phased array antenna system 702 will be described in more detail with reference to FIG. 8.

The communications system 700 or phased array antenna system 702 further includes a beam steering controller 716. The beam steering controller 716 is configured to transmit a control signal 718 or T/R module delay signal 720 to each of the T/R modules 712 for controlling the direction of the signal beam 703. As described with reference to FIG. 8, the control signal 718 or T/R module delay signal 720 is used by the UDE delay filter 818 and 820 in each T/R module 712 or 800 in FIG. 8 to control the direction of the signal beam 703 for either transmitting or receiving RF signals.

Figure 8:
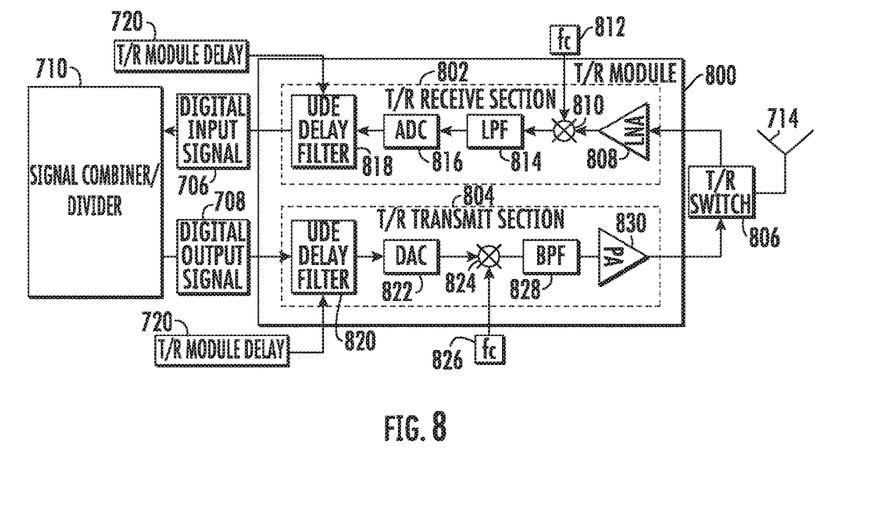
FIG. 8 is a block schematic diagram of an example of a transmit/receive (T/R) module for a phased array antenna system in accordance with an embodiment of the present disclosure.

FIG. 8 is a block schematic diagram of an example of a transmit/receive (T/R) module 800 for a phased array antenna system in accordance with an embodiment of the present disclosure. In accordance with an embodiment, the T/R module 800 is used for the T/R modules 712 in FIG. 7. The T/R module 800 is operatively connected to the signal combiner/divider 710 for receiving input signals 706 and transmitting output signals 708. The T/R module 800 includes a T/R receive section 802 and a T/R transmit section 804 that are each operatively coupled to an antenna or antenna element 714 of the phased array antenna system 702 (FIG. 7) by a transmit/receive (T/R) switching device 806. The T/R switching device 806 is controlled based on whether the phased array antenna system 702 is transmitting or receiving. The T/R switching device 806 is any RF switch for switching between transmit and receive paths as shown in FIG. 8. In accordance with an embodiment, the T/R switching device 806 is a circulator or other device that can transmit and receive signals at the same time and route the signals accordingly.

In accordance with an embodiment, the T/R receive section 802 includes a low noise amplifier (LNA) 808 that is operatively connected to the T/R switching device 806 for receiving RF signals received by the antenna element 714. The LNA 808 is connected to a receive mixer 810. The receive mixer 810 is configured to mix a received signal from the LNA 808 with a reference signal or mixing signal 812 having a center frequency fc. A mixed signal from the receive mixer 810 is filtered by an analog low pass filter (LPF) 814 that filters any outside signals or noise from the mixed signal to produce the desired baseband signal. An analog-to-digital converter (ADC) 816 digitizes or samples the filtered mixed signal from the LPF 814 to provide a digital signal to a receive UDE delay filter 818. The receive UDE delay filter 818 is operatively connected to the signal combiner/divider 710. In accordance with an embodiment, the receive UDE delay filter 818 is the same or similar to the nonlinear filter 112 of FIG. 1 or the digital variable delay filter 200 of FIG. 2. The receive UDE delay filter 820 is configured to delay the input signal 706 by a selected time delay based on the T/R module delay signal 720 similar to that previously described with respect to the nonlinear filter 112 or digital variable delay filter 200 for steering the signal beam 703 in a chosen direction relative to a boresight of the phased array antenna system 702 in FIG. 7.

In accordance with an embodiment, the T/R transmit section 804 includes a transmit UDE delay filter 820 that is operatively connected to the signal combiner/divider 710. The transmit UDE delay filter 820 is the same or similar to the nonlinear filter 112 of FIG. 1 or the digital variable delay filter 200 of FIG. 2. The transmit UDE delay filter 820 is configured to delay the output signal 708 by a selected time delay based on the T/R module delay signal 720 similar to that previously described with respect to the nonlinear filter 112 or digital variable delay filter 200 for steering the signal beam 703 in a chosen direction relative to a boresight of the phased array antenna system 702 in FIG. 7. A digital-to-analog converter (DAC) 822 converts a digital time delayed signal from the UDE delay filter 820 to a delayed analog signal. A transmit mixer 824 mixes the delayed analog signal from the DAC 822 with a mixing signal 826 having a frequency fc. The mixed signal from the transmit mixer 824 is filtered by an analog band pass filter (BPF) 828 to remove any spurious signals or noise from the mixed signal prior to amplification by a power amplifier (PA) 830. The characteristics of this BPF 828 are application specific, depending on the desired transmission characteristics, the intended receiver, Federal Communications Commission/World Radiocommunications Conference (FCC/WRC) regulations, etc. The power amplifier 830 is operatively connected to the T/R switching device 806 for transmitting the amplified signal by the antenna element 714. In accordance with another embodiment, the T/R modules 712 in FIG. 7 may implemented in an analog form using analog variable delay filters the same as or similar to analog variable delay filter 600 in FIG. 6.

Figure 9:
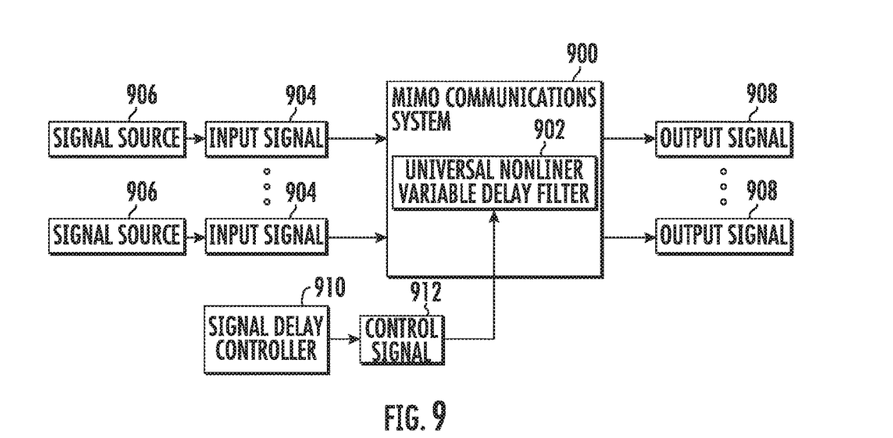
FIG. 9 is a block schematic diagram of an example of a multiple input/multiple output (MIMO) communications system including a universal nonlinear variable delay filter in accordance with an embodiment of the present disclosure.

FIG. 9 is a block schematic diagram of an example of a multiple input/multiple output (MIMO) communications system 900 including a universal nonlinear variable delay filter 902 in accordance with an embodiment of the present disclosure. The universal nonlinear variable delay filter 902 is the same as or similar to the digital variable delay filter 100 of FIG. 1, digital variable delay filter 200 of FIG. 2 or analog variable delay filter 600 of FIG. 6. The MIMO communications system 900 is configured for receiving a multiplicity of input signals 904 from one or more signal sources 906 and transmitting a multiplicity of output signals 908. A signal delay controller 910 transmits a control signal 912 to the universal nonlinear variable delay filter 902 to control a delay of the output signals 908. Similar to that described with respect to the digital variable delay filters 100, 200 and 600, the output signals may be delayed a selected time delay corresponding to a mixing frequency of a mixing signal mixed with the input signals 904.

Figure 10:
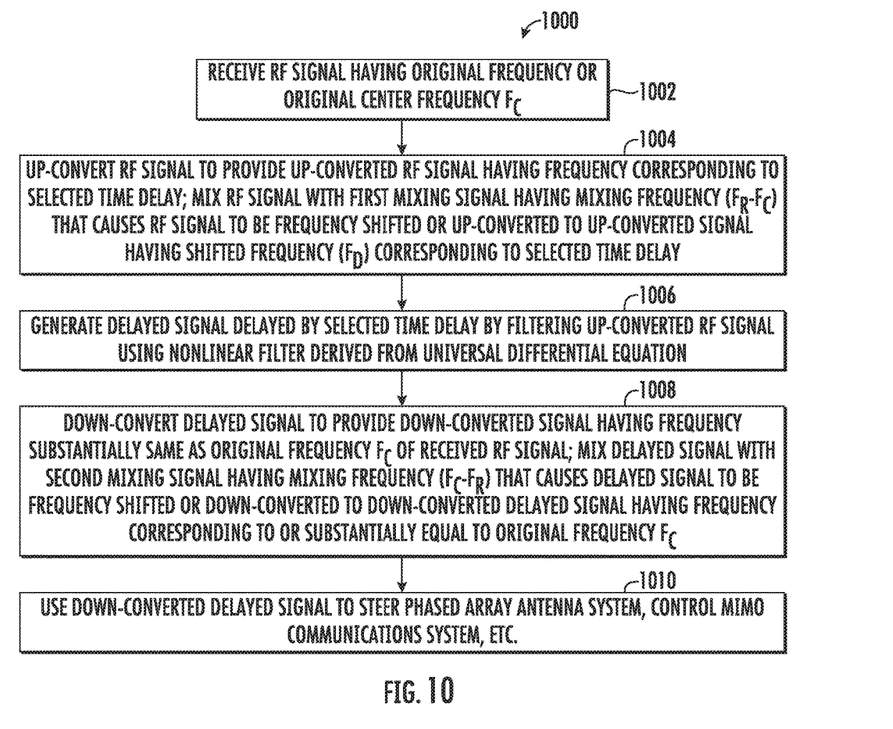
FIG. 10 is a flow chart of an example of a method for delaying a radio frequency (RF) signal in accordance with an embodiment of the present disclosure.

FIG. 10 is a flow chart of an example of a method 1000 for delaying a radio frequency (RF) signal in accordance with an embodiment of the present disclosure. In block 1002, an RF signal is received that has an original frequency or original center frequency Fc.

In block 1004, the received signal or input signal is converted or up-concerted to an up-converted signal including a frequency corresponding to a selected time delay. As previously described, the received signal or input signal is mixed with a first mixing signal having a mixing frequency $(F_R-F_C)$ that causes the input signal to be frequency shifted or up-converted to an up-converted signal having a shifted frequency $(F_D)$ corresponding to a selected time delay.

In block 1006, the up-converted signal is filtered and a delayed signal is generated that is delayed by the selected time delay. The delayed signal is generated by a variable delay filter similar to that previously described. In accordance with an embodiment, filtering the up-converted signal and generating the delayed signal includes providing a universal nonlinear variable delay filter similar to that previously described. The universal nonlinear variable delay filter is implemented in a digital form or an analog form. The selected time delay is controlled by a mixing frequency of a reference signal or a mixing signal mixed with the input signal in the digital form and the selected time delay is controlled by a signal from a voltage controlled oscillator in the analog form.

In block 1008, the delayed signal is converted or down-converted to a down-converted signal having a frequency substantially equal to the original frequency $F_C$ of the received signal or input signal. As previously described, the delayed signal is mixed with a second mixing signal that has a mixing frequency $(F_C-F_R)$ that causes the delayed signal to be frequency shifted or down-converted to a down-converted delay signal that has a frequency corresponding to or substantially equal to the original frequency $F_C$ of the received or input signal.

In block 1010, the down-converted delayed signal is used to steer a phased array antenna system, control a multiple input multiple output communications system or any other application were a delayed signal at a selected time delay is needed.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of embodiments of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to embodiments in the form disclosed. Many modifications and variations will be apparent to those of ordinary skill in the art without departing from the scope and spirit of embodiments.

Although specific embodiments have been illustrated and described herein, those of ordinary skill in the art appreciate that any arrangement which is calculated to achieve the same purpose may be substituted for the specific embodiments shown and that the embodiments have other applications in other environments. This application is intended to cover any adaptations or variations. The following claims are in no way intended to limit the scope of embodiments of the disclosure to the specific embodiments described herein.

What is claimed is:

1. A universal nonlinear variable delay filter, comprising:
   a first mixer configured to convert an input signal to an up-converted signal comprising a frequency corresponding to a selected time delay, the input signal comprising an original frequency;
   a nonlinear filter that filters the up-converted signal and generates a delayed signal that is delayed by the selected time delay; and
   a second mixer configured to convert the delayed signal to a down-converted signal comprising a frequency substantially equal to the original frequency.

2. The universal nonlinear variable delay filter of claim 1, wherein the universal nonlinear variable delay filter is implemented in a digital form or an analog form, wherein the selected time delay is controlled by a mixing frequency of a reference signal or a mixing signal mixed with the input signal in the digital form and the selected time delay is controlled by a signal from a voltage controlled oscillator in the analog form.

3. The universal nonlinear variable delay filter of claim 1, wherein the first mixer is configured to mix the input signal and a first mixing signal comprising a mixing frequency that causes the input signal to be frequency shifted or up-converted to the frequency corresponding to the selected time delay.

4. The universal nonlinear variable delay filter of claim 3, wherein the second mixer is configured to mix the delayed signal and a second mixing signal comprising a mixing frequency that causes the delayed signal to be frequency shifted or down-converted to the frequency substantially equal the original frequency.

5. The universal nonlinear variable delay filter of claim 4, further comprising a variable frequency generator configured for generating the first mixing signal and the second mixing signal.

6. The universal nonlinear variable delay filter of claim 1, wherein the nonlinear filter is derived from a universal differential equation.

7. The universal nonlinear variable delay filter of claim 6, wherein the universal differential equation is discretized and converted to a universal difference equation form that defines a four input filter function.

8. The universal nonlinear variable delay filter of claim 7, wherein the universal differential equation is discretized and converted using centered difference approximations of various derivative orders of the universal differential equation or one sided difference approximations of various derivative orders of the universal differential equation.

9. The universal nonlinear variable delay filter of claim 6, wherein the universal differential equation is discretized and converted to a digital filter form to create a nonlinear digital variable delay filter.

10. The universal nonlinear variable delay filter of claim 6, wherein the nonlinear filter comprises an analog universal differential equation filter and the first mixer and the second mixer each comprise an analog mixer.

11. The universal nonlinear variable delay filter of claim 10, further comprising:
    a voltage controlled oscillator operatively connected to the first mixer and the second mixer, wherein the first mixer mixes the input signal with a first mixing signal from the voltage controlled oscillator to convert the input signal to an analog up-converted signal comprising the frequency corresponding to the selected time delay and wherein the second mixer mixes the delayed signal with a second mixing signal from the voltage controlled oscillator to convert the delayed signal to an analog down-converted signal comprising the frequency substantially equal to the original frequency;
    a low pass filter configured to filter any spurious signals or noise from the analog up-converted signal; and
    a high pass filter configured to filter any spurious signals or noise from the analog down-converted signal to provide an analog delayed signal comprising the frequency substantially equal the original frequency.

12. The universal nonlinear variable delay filter of claim 1, wherein the universal nonlinear variable delay filter is a component of a phased array antenna system.

13. The universal nonlinear variable delay filter of claim 1, wherein the universal nonlinear variable delay filter is a component of a multiple input multiple output communications system.

14. A communications system, comprising:
    a signal source;
    a universal nonlinear variable delay filter operatively connected to the signal source, the universal nonlinear variable delay filter comprising:
    a first mixer configured to convert an input signal to an up-converted signal comprising a frequency corresponding to a selected time delay, the input signal comprising an original frequency;
    a nonlinear filter that filters the up-converted signal and generates a delayed signal that is delayed by the selected time delay; and a second mixer configured to convert the delayed signal to a down-converted signal comprising a frequency substantially equal to the original frequency.

15. The communications system of claim 14, wherein the universal nonlinear variable delay filter is implemented in a digital form or an analog form, wherein the selected time delay is controlled by a mixing frequency of a reference signal or a mixing signal mixed with the input signal in the digital form and the selected time delay is controlled by a signal from a voltage controlled oscillator in the analog form.

16. The communications system of claim 14, wherein the nonlinear filter is derived from a universal differential equation.

17. The communications system of claim 14, further comprising:
   a phased array antenna system comprising a plurality of antenna elements, the phased array antenna system being configured for directing a signal beam in different directions;
   a plurality of transmit/receive (T/R) modules, one T/R module being associated with each antenna element of the phased array antenna system; and
   a beam steering controller, wherein the beam steering controller transmits a particular module delay signal to each T/R module for controlling the direction of the signal beam from the phased array antenna system.

18. The communications system of claim 14, further comprising:
   a multiple input/multiple output communications system configured for receiving a multiplicity of input signals and transmitting a multiplicity of output signals; and
   a signal delay controller, wherein the signal delay controller transmits a control signal to the universal nonlinear variable delay filter to control a delay of the output signals.

19. A method for implementing a delay in a radio frequency (RF) signal, comprising:
   converting an input signal to an up-converted signal comprising a frequency corresponding to a selected time delay, the input signal comprising an original frequency;
   filtering the up-converted signal and generating a delayed signal that is delayed by the selected time delay; and
   converting the delayed signal to a down-converted signal comprising a frequency substantially equal to the original frequency.

20. The method of claim 19, wherein filtering the up-converted signal and generating the delayed signal comprises providing a universal nonlinear variable delay filter, the universal nonlinear variable delay filter being implemented in a digital form or an analog form, wherein the selected time delay is controlled by a mixing frequency of a reference signal or a mixing signal mixed with the input signal in the digital form and the selected time delay is controlled by a signal from a voltage controlled oscillator in the analog form.

* * * * *